(12) United States Patent
Koike et al.

(10) Patent No.: US 9,812,743 B2
(45) Date of Patent: Nov. 7, 2017

(54) BATTERY STATE MONITORING CIRCUIT AND BATTERY DEVICE

(71) Applicant: Seiko Instruments Inc., Chiba-shi, Chiba (JP)

(72) Inventors: Toshiyuki Koike, Chiba (JP); Kazuaki Sano, Chiba (JP); Atsushi Sakurai, Chiba (JP); Hiroshi Mukainakano, Chiba (JP)

(73) Assignee: SII SEMICONDUCTOR CORPORATION, Chiba (JP)

( * ) Notice: Subject to any disclaimer, the term of this patent is extended or adjusted under 35 U.S.C. 154(b) by 240 days.

(21) Appl. No.: 14/753,722

(22) Filed: Jun. 29, 2015

(65) Prior Publication Data

US 2015/0380774 A1    Dec. 31, 2015

(30) Foreign Application Priority Data

Jun. 30, 2014  (JP) .................. 2014-134401

(51) Int. Cl.

| | |
|---|---|
| *H02J 7/00* | (2006.01) |
| *H02J 7/04* | (2006.01) |
| *G01N 27/416* | (2006.01) |
| *H01M 10/48* | (2006.01) |
| *G01R 31/36* | (2006.01) |
| *H01M 10/44* | (2006.01) |

(52) U.S. Cl.
CPC ........ *H01M 10/48* (2013.01); *G01R 31/3606* (2013.01); *G01R 31/3662* (2013.01); *H01M 10/44* (2013.01)

(58) Field of Classification Search
CPC ......... Y02E 60/12; H02J 7/0047; H02J 7/008; H02J 7/0031; H02J 7/0078; G01R 31/3648; G01R 31/3651; G01R 31/3624; G01R 19/16542; G01R 31/3658; G01R 31/3682; G01R 31/3606; G01R 31/3662; H01M 10/48; H01M 10/44

USPC .................. 320/132, 148, 149; 324/433

See application file for complete search history.

(56) References Cited

U.S. PATENT DOCUMENTS

| | | | | |
|---|---|---|---|---|
| 6,150,823 A | * | 11/2000 | Takahashi .......... | G01R 31/3631 324/427 |
| 2012/0306450 A1 | * | 12/2012 | Nakayama .............. | G06F 1/263 320/134 |
| 2014/0333317 A1 | * | 11/2014 | Frost .................. | G01R 31/3606 324/430 |
| 2015/0137820 A1 | * | 5/2015 | Mikuteit ............ | G01R 31/3644 324/426 |

FOREIGN PATENT DOCUMENTS

| | | | |
|---|---|---|---|
| JP | 2000-133322 A | | 5/2000 |
| JP | 2000133322 A | * | 5/2000 |

* cited by examiner

*Primary Examiner* — Yalkew Fantu
*Assistant Examiner* — Mohammed J Sharief
(74) *Attorney, Agent, or Firm* — Brinks Gilson & Lione

(57) ABSTRACT

Provided is a battery state monitoring circuit and a battery device capable of predicting a state of charge of a secondary battery with high accuracy. The battery state monitoring circuit includes a pseudo-equivalent circuit of the secondary battery, and causes a current flowing through a sense resistor to flow to the pseudo-equivalent circuit of the secondary battery, to thereby measure a pseudo-open circuit voltage of the secondary battery.

6 Claims, 5 Drawing Sheets

BATTERY STATE MONITORING CIRCUIT AND BATTERY DEVICE

RELATED APPLICATIONS

This application claims priority under 35 U.S.C. §119 to Japanese Patent Application No. 2014-134401 filed on Jun. 30, 2014, the entire content of which is hereby incorporated by reference.

BACKGROUND OF THE INVENTION

1. Field of the Invention

The present invention relates to a battery state monitoring circuit for detecting a voltage and an abnormality of a secondary battery, and to a battery device. More particularly, the present invention relates to a battery state monitoring circuit having a function of predicting a state of charge of the secondary battery and a function of evaluating deterioration of the secondary battery, and to a battery device.

2. Description of the Related Art

FIG. 5 is a schematic diagram for illustrating a related-art battery device including a battery state monitoring circuit. The related-art battery device includes a battery state monitoring circuit, a secondary battery 501, a current source 511, a current source 512, and a switching circuit 510. The secondary battery 501 can be represented by an equivalent circuit of a battery capacitor 502, a resistor 503, a resistor 504, and a capacitor 505. The switching circuit 510 is operated to switch the current source 511 and the current source 512. The current source 511 and the current source 512 cause currents having different current values I1 and I2, respectively, to flow.

The switching circuit 510 switches the current source 511 and the current source 512 so that a charge current to the secondary battery 501 is periodically changed. Then, a voltage of the secondary battery is measured at the respective time points, to thereby determine resistance values of the resistor 503 and the resistor 504.

A method of evaluating a lifetime of the secondary battery with the use of those resistance values is disclosed (for example, see Japanese Patent Application Laid-open No. 2000-133322).

SUMMARY OF THE INVENTION

The present invention provides a battery state monitoring circuit and a battery device capable of predicting a state of charge of a secondary battery while the secondary battery is being charged by any charger, predicting the state of charge of the secondary battery even when a current or a voltage of the secondary battery is varied or while the secondary battery is being discharged, and evaluating a lifetime of the secondary battery without calculation of an approximate expression.

In order to solve the related-art problems, a battery device including a battery state monitoring circuit according to one embodiment of the present invention has the following configuration.

The battery state monitoring circuit includes: a pseudo-equivalent circuit of a secondary battery; a sense resistor for detecting a charge and discharge current of the secondary battery; a voltage-current converter including input terminals respectively connected to both ends of the sense resistor and an output terminal connected to the pseudo-equivalent circuit, for measuring a voltage between the both ends of the sense resistor, to thereby cause a current depending on the charge and discharge current to flow to the pseudo-equivalent circuit; a first A/D converter for monitoring a voltage of a first terminal; a second A/D converter for monitoring an open circuit voltage of the pseudo-equivalent circuit; and an arithmetic circuit for detecting a state of charge of the secondary battery based on an output signal of the first A/D converter and an output signal of the second A/D converter.

The battery device including the battery state monitoring circuit according to the one embodiment of the present invention has the effects in that the state of charge of the secondary battery can be predicted with high accuracy while the secondary battery is being charged by a general charger or even when the current or the voltage of the secondary battery is varied, and the lifetime of the secondary battery can be evaluated without the calculation of the approximate expression.

DETAILED DESCRIPTION OF THE PREFERRED EMBODIMENTS

Now, embodiments of the present invention are described with reference to the drawings.

First Embodiment

Figure 1:
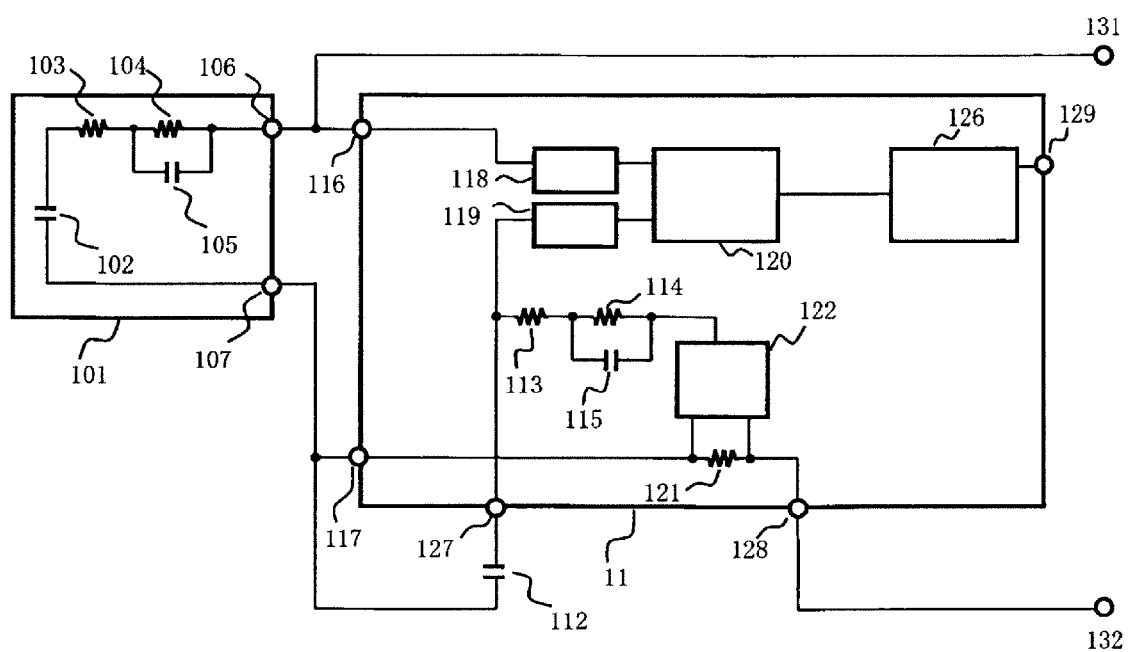
FIG. 1 is a block diagram of a battery device including a battery state monitoring circuit according to a first embodiment of the present invention.

FIG. 1 is a block diagram of a battery device including a battery state monitoring circuit according to a first embodiment of the present invention. The battery device including the battery state monitoring circuit of the first embodiment includes a battery state monitoring circuit 11, a secondary battery 101, a capacitor 112, and an external terminal 131 and an external terminal 132 to each of which a charger or a load is to be connected.

The secondary battery 101 includes a positive terminal 106 and a negative terminal 107. The secondary battery 101 can be represented by an equivalent circuit of a battery capacitor 102, a resistor 103, a resistor 104, and a capacitor 105.

The battery state monitoring circuit 11 includes a VDD terminal 116, a VSS terminal 117, a capacitor connection terminal 127, an external connection terminal 128, and an output terminal 129.

The secondary battery 101 has the negative terminal 107 connected to the VSS terminal 117 of the battery state monitoring circuit 11, and the positive terminal 106 connected to the VDD terminal 116 of the battery state monitoring circuit 11.

The capacitor 112 is connected between the capacitor connection terminal 127 and the VSS terminal 117 of the battery state monitoring circuit 11.

The battery state monitoring circuit 11 has the VDD terminal 116 connected to the external terminal 131, and the external connection terminal 128 connected to the external terminal 132.

The battery state monitoring circuit 11 includes a resistor 113, a resistor 114, a capacitor 115, an A/D converter 118, an A/D converter 119, an arithmetic circuit 120, a sense resistor 121, a voltage-current converter 122, and a communication circuit 126. The A/D converter 118 monitors a voltage of the secondary battery 101. The A/D converter 119 monitors a voltage of the capacitor connection terminal 127.

The resistor 113 and the resistor 114 connected in series, and the capacitor 115 connected in parallel with the resistor 114 are connected between the capacitor connection terminal 127 and an output terminal of the voltage-current converter 122. The sense resistor 121 is connected between the external connection terminal 128 and the VSS terminal 117. The voltage-current converter 122 has a first input terminal and a second input terminal to which both ends of the sense resistor 121 are respectively connected. The A/D converter 118 has an input terminal connected to the VDD terminal 116. The A/D converter 119 has an input terminal connected to the capacitor connection terminal 127. The arithmetic circuit 120 has a first input terminal connected to an output terminal of the A/D converter 118, and a second input terminal connected to an output terminal of the A/D converter 119. The communication circuit 126 has an input terminal connected to an output terminal of the arithmetic circuit 120, and an output terminal connected to the output terminal 129 of the battery state monitoring circuit 11. Although not illustrated, the voltage-current converter 122 and the like each have positive and negative power supply terminals to which the VDD terminal 116 and the VSS terminal 117 are respectively connected.

Next, operation of the battery state monitoring circuit of the first embodiment is described.

The capacitor 112, the resistor 113, the resistor 114, and the capacitor 115 form the same circuit as the equivalent circuit of the secondary battery 101.

A capacitance value of the battery capacitor 102 is represented by Cbat, a resistance value of the resistor 103 is represented by Rb1, a resistance value of the resistor 104 is represented by Rb2, a capacitance value of the capacitor 105 is represented by Cb, a capacitance value of the capacitor 112 is represented by Cmdb, a resistance value of the resistor 113 is represented by Rmd1, a resistance value of the resistor 114 is represented by Rmd2, and a capacitance value of the capacitor 115 is represented by Cmd. The values are set so that, when it is assumed that Cbat of the battery capacitor 102 and Cmdb of the capacitor 112 have a relationship of Cmdb/Cbat=N (N is a constant), Cmd=Cb×N, Rmd1=Rb1/N, and Rmd2=Rb2/N are established for the other elements. A current flowing to the secondary battery 101 is represented by Ibat, and is set so that Imd=Ibat×N is established. A charge current and a discharge current have opposite signs. The current Imd is a current flowing between the output terminal of the voltage-current converter 122 and the VSS terminal 117.

The charge current Ibat flows to the secondary battery 101 from the external terminal 131. Further, the charge current Ibat flows to the external connection terminal 128 from the VSS terminal 117 through the sense resistor 121, and then flows to the external terminal 132. A resistance value of the sense resistor 121 is obtained by measuring a resistance value Rs between the VSS terminal 117 and the external terminal 128. Thus, through measurement of a voltage Vs between the both ends of the sense resistor 121 by the voltage-current converter 122, a value (Vs/Rs) of the current Ibat is determined and the current Imd can be generated. The voltage-current converter 122 can charge or discharge the capacitor 112 with the current Imd through the resistor 114 and the resistor 113. With the operation of the battery state monitoring circuit 11 in this manner, pseudo charge and discharge of the secondary battery 101 can be performed by the battery state monitoring circuit 11 and the capacitor 112.

Therefore, through measurement of the voltage of the capacitor connection terminal 127 by the A/D converter 119, a pseudo-voltage value (open circuit voltage) of the battery capacitor 102 of the secondary battery 101 can be obtained. Then, this measured value is input to the arithmetic circuit 120. The arithmetic circuit 120 stores an upper limit value and a lower limit value of the open circuit voltage of the secondary battery 101. The arithmetic circuit 120 can compare and calculate the upper and lower limit values and the measured value, to thereby predict the state of charge of the secondary battery 101. The predicted value of the state of charge is output to the output terminal 129 through the communication circuit 126, and then transmitted to an externally-connected device, for example.

In this case, in order to predict the state of charge with high accuracy, for example, the capacitors may be selected so that the capacitor 112 and capacitor 102 have similar characteristics, and the capacitor 115 and capacitor 105 have similar characteristics. Moreover, the resistors may be selected so that the resistor 113 and the resistor 103 have similar characteristics, and the resistor 114 and the resistor 104 have similar characteristics.

Note that, although not illustrated, a switching circuit may perform switching so that the input terminal of the A/D converter 119 may be connected to the capacitor connection terminal 127 or a second terminal of the resistor 114. With this, an internal impedance of the secondary battery 101 increased with time can be detected. Therefore, through correction of a voltage of the capacitor 112 with the use of the detection result, the state of charge can be predicted with higher accuracy.

Moreover, the voltage of the secondary battery 101 can be measured by the A/D converter 118. It is also possible to measure a voltage of the secondary battery 101 when no load is applied and a current and a voltage of the secondary battery 101 when a current flows, and calculate the resistance values of the resistor 103 and the resistor 104 by the arithmetic circuit so that the arithmetic circuit stores the resultant values. The resistance values can be compared to initial values, to thereby determine deterioration degrees of the resistor 103 and the resistor 104 each corresponding to the internal resistance of the secondary battery.

Moreover, the arithmetic circuit 120 can also compare the voltage of the secondary battery 101 when no load is applied that is measured by the A/D converter 118, and the voltage of the capacitor connection terminal 127 measured by the A/D converter 119.

Moreover, although not illustrated, a temperature measurement circuit can be mounted so that the arithmetic circuit 120 can store temperature information. In this case, it is also possible to correct Imd, the resistor 114 being a variable resistor, and the resistor 113 being a variable resistor while taking into consideration a change in temperature characteristics.

Moreover, the sense resistor 121 may be built in the battery state monitoring circuit 11, or formed by external components.

Figure 2:
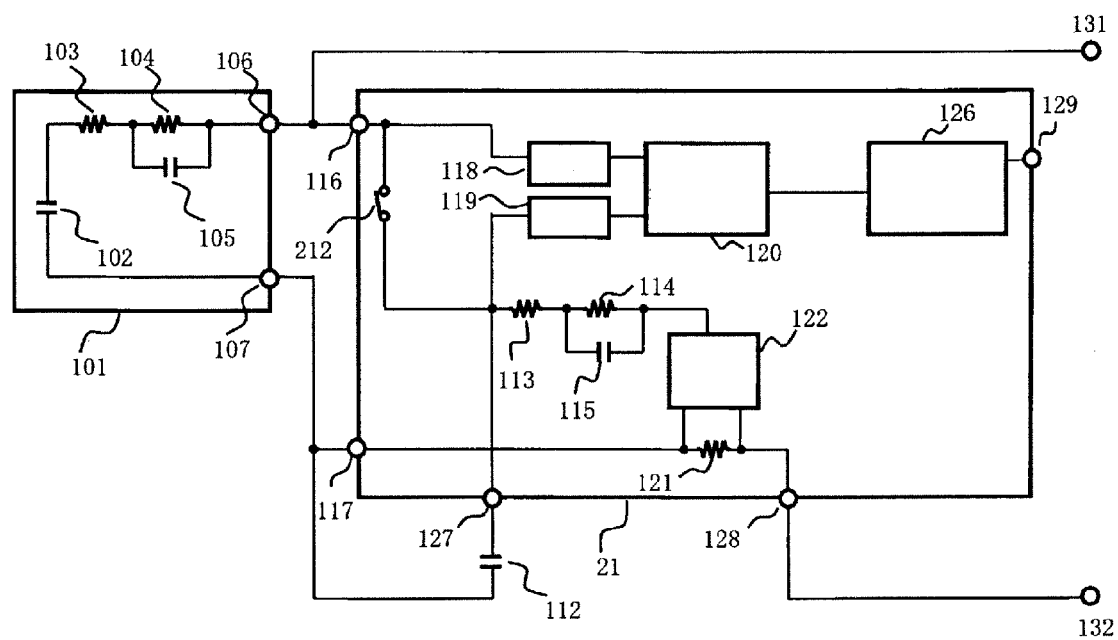
FIG. 2 is a block diagram of a battery device including a battery state monitoring circuit according to another example of the first embodiment.

FIG. 2 is a block diagram of a battery device including a battery state monitoring circuit according to another example of the first embodiment. As illustrated in FIG. 2, a switching circuit 212 may be connected between the VDD terminal 116 and the capacitor connection terminal 127.

In a battery state monitoring circuit 21 formed as illustrated in FIG. 2, the switching circuit 212 can be short-circuited when a charge and discharge current does not flow to the secondary battery 101, so that the voltage of the capacitor 112 can be controlled to be equal to the voltage of the secondary battery 101 while the switching circuit 212 is being short-circuited.

The other operations are the same as those of the battery state monitoring circuit 11 of FIG. 1. Therefore, the state of charge of the secondary battery 101 can be predicted with high accuracy.

Note that, the switching circuit 212 may be repeatedly open-circuited and short-circuited at an arbitrary period.

As described above, according to the battery device including the battery state monitoring circuit of the first embodiment, only through the measurement of the voltage value of the capacitor connection terminal 127, the state of charge of the secondary battery 101 can be predicted with high accuracy.

Second Embodiment

Figure 3:
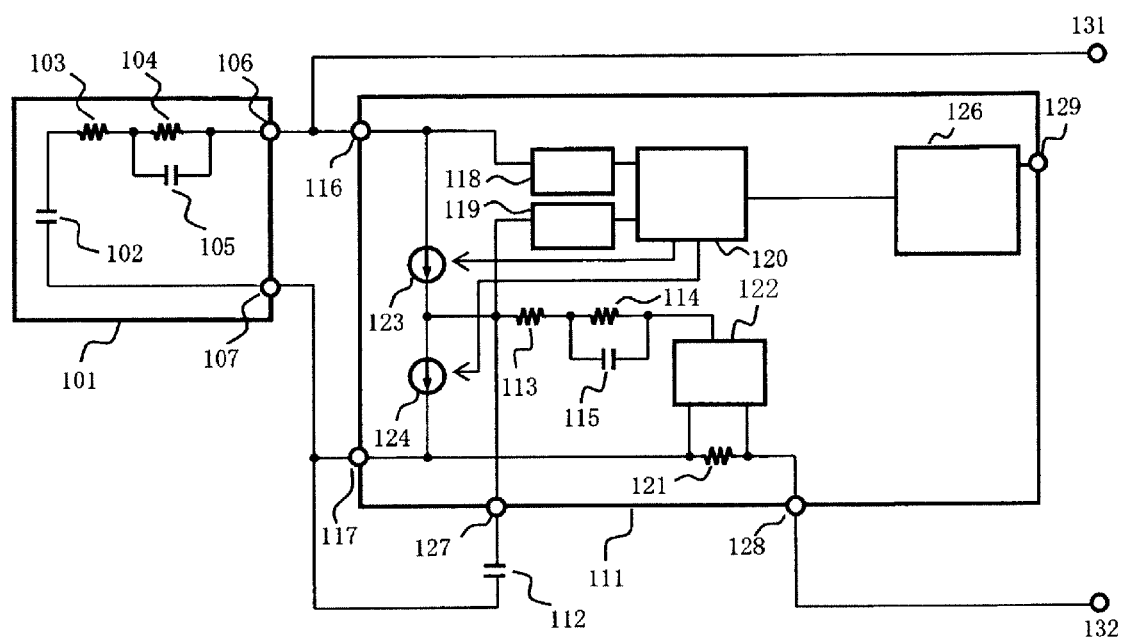
FIG. 3 is a block diagram of a battery device including a battery state monitoring circuit according to a second embodiment of the present invention.

FIG. 3 is a block diagram of a battery device including a battery state monitoring circuit according to a second embodiment of the present invention. Now, differences from the battery state monitoring circuit of the first embodiment are described.

A battery state monitoring circuit 111 further includes a constant current circuit 123 and a constant current circuit 124. The arithmetic circuit 120 further includes a second output terminal and a third output terminal.

The constant current circuit 123 is connected between the VDD terminal 116 and the capacitor connection terminal 127, and has a control terminal to which the second output terminal of the arithmetic circuit 120 is connected. The constant current circuit 124 is connected between the capacitor connection terminal 127 and the VSS terminal 117, and has a control terminal to which the third output terminal of the arithmetic circuit 120 is connected.

Next, operation of the battery state monitoring circuit of the second embodiment is described.

A pseudo circuit of the equivalent circuit of the secondary battery 101 in this embodiment is the same as that of the battery state monitoring circuit of the first embodiment, and hence a description thereof is omitted.

The arithmetic circuit 120 compares the voltage of the secondary battery 101 when no load is applied that is measured by the A/D converter 118, and the voltage of the capacitor 112 measured by the A/D converter 119. At this time, when the compared voltages have a difference, the arithmetic circuit 120 controls the constant current circuit 123 and the constant current circuit 124 so that the voltage of the capacitor 112 and the voltage of the secondary battery 101 when no load is applied are equal to each other. With this configuration, the battery state monitoring circuit 111 can predict the state of charge of the secondary battery 101 with high accuracy.

Figure 4:
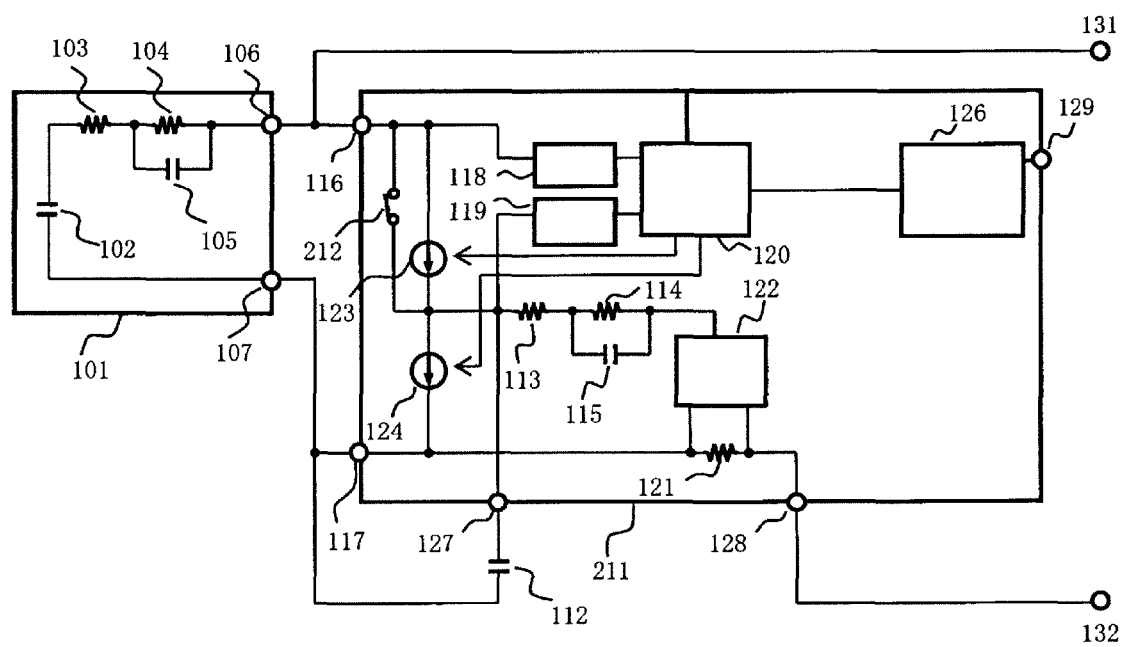
FIG. 4 is a block diagram of a battery device including a battery state monitoring circuit according to another example of the second embodiment.
Figure 5:
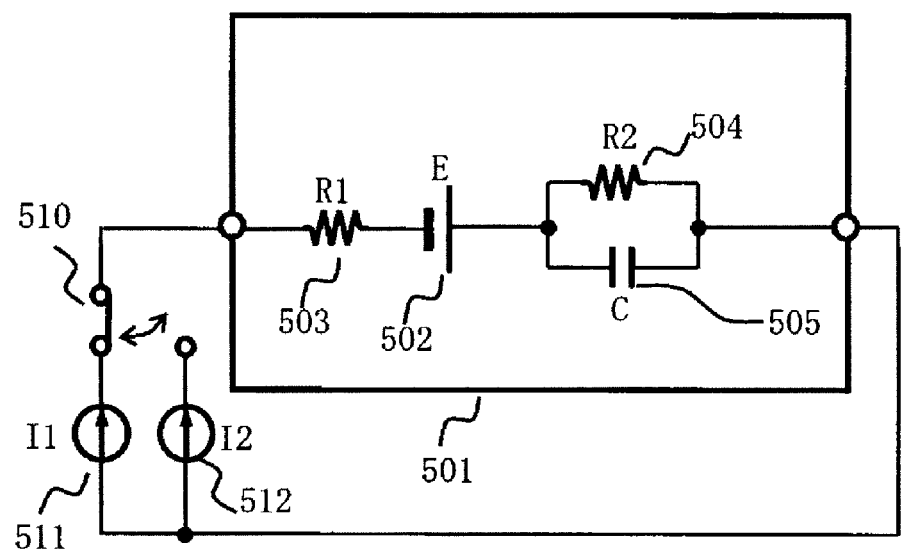
FIG. 5 is a schematic diagram of a related-art battery device including a battery state monitoring circuit.

FIG. 4 is a block diagram of a battery device including a battery state monitoring circuit according to another example of the second embodiment. As illustrated in FIG. 4, the switching circuit 212 may be connected between the VDD terminal 116 and the capacitor connection terminal 127.

In a battery state monitoring circuit 211 formed as illustrated in FIG. 4, the switching circuit 212 can be short-circuited when a charge and discharge current does not flow to the secondary battery 101, so that the voltage of the capacitor 112 can be controlled to be equal to the voltage of the secondary battery 101 while the switching circuit 212 is being short-circuited.

The other operations are the same as those of the battery state monitoring circuit 111 of FIG. 3. Therefore, the state of charge of the secondary battery 101 can be predicted with higher accuracy.

Note that, the switching circuit 212 may be repeatedly open-circuited and short-circuited at an arbitrary period.

As described above, according to the battery device including the battery state monitoring circuit of the second embodiment, only through the measurement of the voltage value of the capacitor connection terminal 127, the state of charge of the secondary battery 101 can be predicted and determined with high accuracy.

Note that, the battery state monitoring circuits of the first embodiment and the second embodiment may include a protection circuit (not shown) for monitoring the voltage of the secondary battery 101, and control a charge and discharge control switch (not shown) connected to a charge and discharge path, to thereby prevent overcharge and overdischarge of the secondary battery 101.

As described above, according to the battery device including the battery state monitoring circuit of the present invention, only through the measurement of the voltage value of the capacitor connection terminal 127, the state of charge of the secondary battery 101 can be predicted and determined with high accuracy, and further the safety can be improved.

What is claimed is:

1. A battery state monitoring circuit for monitoring charge and discharge of a secondary battery, to thereby detect a state of charge of the secondary battery, the battery state monitoring circuit comprising:
 a first terminal and a second terminal to which the secondary battery is connected;
 an equivalent circuit of the secondary battery, the equivalent circuit comprising a first capacitor, a first resistor and a second resistor connected in series, and a second capacitor connected in parallel with the second resistor;
 a sense resistor for detecting a charge and discharge current of the secondary battery;
 a voltage-current converter including input terminals respectively connected to both ends of the sense resistor and an output terminal connected to the equivalent circuit, for measuring a voltage between the both ends of the sense resistor, to thereby cause a current depending on the charge and discharge current to flow to the equivalent circuit;
 a first A/D converter for monitoring a voltage of the first terminal;
 a second A/D converter for monitoring an open circuit voltage of the equivalent circuit; and
 an arithmetic circuit for detecting the state of charge of the secondary battery based on an output signal of the first A/D converter and an output signal of the second A/D converter.

2. The battery state monitoring circuit according to claim 1, wherein the first capacitor includes one terminal connected to the second terminal and the first resistor and second resistor are connected in series between another terminal of the first capacitor and the output terminal of the voltage-current converter and the second capacitor is connected in parallel with the second resistor, and
wherein the second A/D converter measures a voltage of the another terminal of the first capacitor.

3. The battery state monitoring circuit according to claim 1, further comprising:
a first constant current circuit connected between the first terminal and another terminal of the first capacitor; and
a second constant current circuit connected between the another terminal of the first capacitor and the second terminal.

4. The battery state monitoring circuit according to claim 2, further comprising:
a first constant current circuit connected between the first terminal and another terminal of the first capacitor; and
a second constant current circuit connected between the another terminal of the first capacitor and the second terminal.

5. The battery state monitoring circuit according to claim 1, further comprising a switching circuit connected between the first terminal and another terminal of the first capacitor.

6. A battery device, comprising:
a secondary battery; and
the battery state monitoring circuit according to claim 1.

* * * * *